INVENTOR,
DANIEL L. CURTIS
BY
Seymour M. Rosenberg
ATTORNEY

VOLTAGE CORRECTED DIODE GATES

Filed Sept. 20, 1955 3 Sheets-Sheet 3

INVENTOR.
DANIEL L. CURTIS

BY

Seymour M. Rosenberg

ATTORNEY

INVENTOR,
DANIEL L. CURTIS
BY
Seymour M. Rosenberg
ATTORNEY

United States Patent Office 2,957,089

Patented Oct. 18, 1960

2,957,089

VOLTAGE CORRECTED DIODE GATES

Daniel L. Curtis, Manhattan Beach, Calif., assignor, by mesne assignments, to Litton Industries Inc., Beverly Hills, Calif., a corporation of Delaware Filed Sept. 20, 1955, Ser. No. 535,374

17 Claims. (Cl. 307—88.5)

The present invention relates to diode gating circuits, such as are utilized in electronic digital computing and switching circuits, and more particularly to voltage corrected diode gates whose bilevel output signals are in the same voltage region as applied bilevel input signals.

In recent years, the introduction of new types of flip-flop circuits, notably transistor flip-flops, which can be triggered from one stable state to another stable state, by signals of very small voltage amplitude (considerably less than 1 volt) has aroused great interest in the use of low voltage swings in the diode gating networks which are conventionally associated with flip-flops in computing and switching systems. Older types of flip-flops reqiured triggering signals of 4 or 5 volts amplitude and therefore, for reliable triggering, voltage swings, in associated diode gates, of 10 to 15 volts were commonly used. Because of these relatively high voltage swings, large amounts of power were dissipated in prior art diode gates.

With the newer types of flip-flops, reliable triggering of flip-flops can be accomplished with signals of far smaller amplitude, of the order of 2 volts or less. Thus, from the criterion of reliable flip-flop triggering very low amplitude voltage swings of this order may now be utilized in diode gating networks, with concomitant large savings in expenditure of electrical power.

However, one circuit difficulty has thus far prevented the effective use of low voltage swings of this order in diode gating networks. This difficulty arises from the fact that the semiconductor diodes, which are commonly used in the diode gates of prior art gating networks, have a finite voltage drop (forward drop) across them when current flows through them in their conductive or forward direction. Because of this effect, when bilevel (high and low level) input signals are applied to a prior art diode gate, the forward voltage drop through the diodes in the gate adds to or subtracts from the voltage levels of the input signals so that the levels of the resultant output signal produced by the gate are displaced by the forward drop from the levels of the input signals.

Thus in a prior art gate in which each input signal to the gate swings over a 2 volt range between a predetermined low level (0 volts for example) and a predetermined high level (+2 volts, for example), a resultant output signal from the gate although normally having the same 2 volt swing, has its low and high levels uniformly displaced by the amount of the forward drop in the diodes of the gate. Suppose for example that a type of prior art gate is used in which input signals are applied to the cathodes of a plurality of diode rectifiers, an output signal being taken from a common junction of the anodes of the rectifiers. In such a gate (usually called an "and" gate) the forward drop in the gate diodes will add to the levels of the input signals, so that for example if a forward drop of .5 volt is assumed, the output signal from the "and" gate will swing between a low level of .5 volt and a high level of 2.5 volts rather than between 0 volts and 2 volts. On the other hand in another type of gate (a so called "or" gate) in which input signals are applied to the anodes of a plurality of diode rectifiers and an output signal derived from a common junction of the rectifier cathodes, the forward drop in the gate diodes will subtract from the levels of the input signals, so that an output signal swinging between a low level of —.5 volt and a high level of 1.5 volts might be obtained.

A severe difficulty arises when gates of the type described are cascaded—that is when gate output signals are used as input signals to successive gates. In such a cascaded arrangement, many gates will receive both displaced input signals (supplied as output signals from preceding gates) and also undisplaced input signals (derived from flip-flop circuits associated with the diode gates). However it is well known that a diode gate does not operate reliably unless all input signals to the gate swing between the same high and low levels. If some of the input signals to a gate are displaced relative to other input signals, gate performance will be impaired. If the displacement is a large enough proportion of the signal swing, the gate may even become inoperable in that it may produce incorrect output signals. Thus the described difficulties become particularly acute when low voltage swings are utilized.

One method which has been proposed in the prior art to permit the use of low voltage swings with cascaded diode gating is to, in connection with each gate, artificially displace the voltage levels of input signals derived from flip-flop circuits to correspond with the voltage displacement of other input signals derived from preceding diode gates. Such a proposal has been advanced in U.S. Patent 2,706,811 by Floyd G. Steele. As described by Steele, artificial displacement of flip-flop signals is accomplished by placing series resistors in those input lines of a gate to which flip-flop signals are applied. Input lines coming from preceding diode gates are unchanged. Resistor values are selected so that the average voltage drop across the resistors, owing to the flow of gating currents through the resistors, displaces the flip-flop signals by approximately the same amount that gate derived input signals have been displaced by forward drops across the diodes of preceding gates.

In a cascaded "and" gate combination using this prior art method, in which there is a voltage rise of .5 volt across each successive gate, flip-flop input signals to a second stage gate of such a combination would be raised approximately .5 volt by means of introduction of series resistors, to thereby displace the flip-flop signals by an amount corresponding to the displacement of input signals derived from a preceding (first stage) "and" gate. In the same manner flip-flop signals to a third stage gate of such a cascaded combination would be raised by 1 volt and flip-flop signals to a fourth stage would be raised by approximately 1.5 volts through introduction of appropriate series resistors in flip-flop input lines to the third and fourth stage gates. Thus the conventional voltage rise across each stage of "and" gating is accompanied by a corresponding artificial rise in the voltage levels of flip-flop signals applied to the gates. In this manner all signals to a gate, whether derived from flip-flops or from preceding gates, tend to swing together between the same limits thereby permitting effective operation of the gates.

However, the described system proposed by Steele has certain marked disadvantages. One disadvantage is that the voltage rise or drop afforded by a series resistor is directly proportional to the current flowing through the resistor. Thus a resistor which affords a desired voltage rise of .5 volt when a particular current flows therethrough may on the other hand produce a voltage rise of only .05 volt when the current drops to a tenth of its initial value, thereby completely nullifying the voltage compensating action of the series resistor. Those skilled in the art will recognize moreover that in diode gating networks, current variations by factors of ten or more are often encountered and that therefore such nullification of the voltage compensating action of series resistors will be met with great frequency.

Another disadvantage arises from the fact that in the system described by Steele, voltage levels rise (or fall) at each successive stage of cascaded gating. There are certain signals, so-called clock-pulse signals or timing signals, applied to the gates which are not derived from flip-flops or from preceding diode gates. It is desirable that these timing signals be applied in full strength, undiminished by passage through series resistors. Therefore, series resistors cannot be utilized to raise or lower the levels of these timing signals. It is therefore necessary to provide a plurality of sources for these timing signals, one source for each level of voltage displacement used in the diode gating networks. Thus a timing signal from one source may swing between 0 and +2 volts, while a timing signal from a second source may swing between .5 volt and 2.5 volts. The timing signal from the first source would be utilized with a first stage "and" gate while the timing signal from the second source would be utilized with a second stage "and" gate.

In contrast to the described prior art method, the present invention provides means for utilizing low voltage swings in connection with cascaded diode gating networks which is relatively independent of variations of current in the gating networks and which requires use of only a single source of timing signals. According to the basic concept of the present invention, voltage corrected diode gates are provided having output signals which are undisplaced with respect to the levels of input signals applied to the gates. Thus output signals produced by the voltage corrected diode gates of the present invention swing between the same predetermined voltage levels as flip-flop input signals applied to the gate. There is no voltage rise or fall across such a gate and therefore the voltage corrected diode gates of the present invention may be cascaded in complex gating networks without ill effect, since all inputs to latter stage gates will swing between the same predetermined levels without relative displacement of gate derived input signals with respect to flip-flop derived input signals.

A voltage corrected diode gate of the present invention comprises a conventional diode gate having a voltage rise or fall thereacross, and a voltage correction circuit coupled to the diode gate for receiving the displaced output signal produced by the gate and reproducing the signal substantially restored to the predetermined levels of input signals applied to the gate. The voltage correction circuit includes a semiconductor diode rectifier which is connected to the diode gate in such a manner that the forward drop across the diode complements the displacement of the levels of the voltage displaced signal produced by the conventional diode gate. If for example the diode gate has a voltage rise thereacross, the diode (called the "correcting diode") in the voltage correction circuit is connected so that the forward drop across the correcting diode subtracts from the voltage levels of the positively displaced signal produced by the conventional diode gate. In the same manner if the diode gate has a voltage drop thereacross the correcting diode is connected so that its forward drop adds to the voltage levels of the gate output signal.

Preferably, the correcting diode and the diodes contained in the conventional diode gate will have like conduction characteristics, each diode having an abrupt transition from a nonconductive to a highly conductive state when a predetermined voltage (called the "conduction voltage") is applied across the diode, and having moreover very low dynamic resistance in its conductive state so that a large increase in current through the diode is accompanied by only a small increase in voltage across the diode. Because of the highly non-linear characteristic of such a diode, forward drop across the diode is substantially equal to the conduction voltage of the diode and is relatively independent of current variations. In a voltage corrected gate of the present invention which utilizes such diodes, voltage displacement across the conventional diode gate will therefore be substantially equal to the conduction voltage of the gate diodes. Complementary voltage displacement, that is displacement in the opposite direction by an amount substantially equal to the conduction voltage, will be accomplished by the correcting diode. In this manner a voltage displaced signal produced by the conventional diode gate may be substantially restored to its predetermined levels by the action of the correcting diode.

It is therefore an object of the present invention to provide a voltage corrected diode gate producing a bilevel output signal undisplaced with respect to the levels of bilevel input signals applied to the gate.

It is another object of the present invention to provide a voltage corrected diode gate comprising a conventional logical diode gate producing a bilevel output signal displaced with respect to the voltage levels of applied bilevel input signals, and a voltage correction circuit for complementarily displacing the output signal to thereby restore the output signal to the levels of the input signals.

It is still another object of the present invention to provide a voltage corrected diode gate employing semiconductor diodes having a predetermined conduction voltage and including a conventional diode gate having a voltage displacement thereacross substantially equal to the conduction voltage and a voltage correction circuit coupled thereto having an oppositely directed voltage displacement thereacross substantially equal to the conduction voltage.

It is yet another object of the invention to provide cascaded diode gating networks comprising series connected voltage corrected diode gates, each voltage corrected diode gate receiving input signals swinging between predetermined high and low levels and also receiving additional input signals swinging between the same predetermined levels derived from preceding voltage corrected diode gates.

It is yet another object of the invention to provide, in a cascaded diode gating network, a voltage correction circuit for correcting the voltage levels of a displaced output signal produced by a preceding diode gate and applying the signal as an input signal to a succeeding diode gate.

It is still another object of the present invention to provide in a cascaded diode gating network employing semiconductor diode rectifiers having a predetermined conduction voltage, a diode voltage correction circuit for receiving an output signal from a preceding gate which is displaced by substantially the conduction voltage from the levels of input signals applied to the gate and for oppositely displacing the output signal by substantially the conduction voltage before applying the signal to the succeeding diode gate.

The novel features which are believed to be characteristic of the invention both as to its organization and method of operation together with further objects and advantages thereof, will be better understood from the following description considered in connection with the accompanying drawings in which preferred embodiments of the invention are illustrated by way of example. It is to be expressly understood however that the drawings are for the purpose of illustration and description only, and are not intended as a definition of the limits of the invention.

Figure 3B:
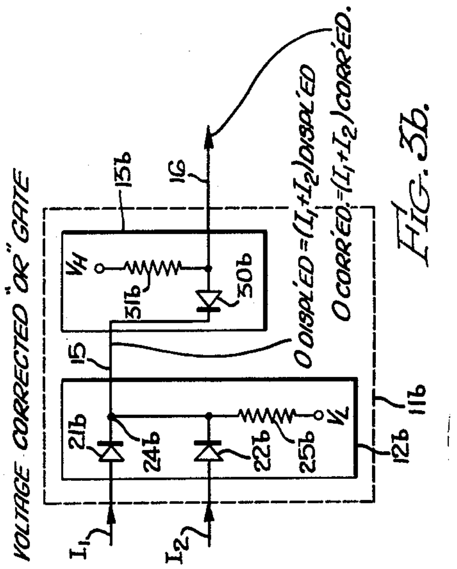
Figure 3A:
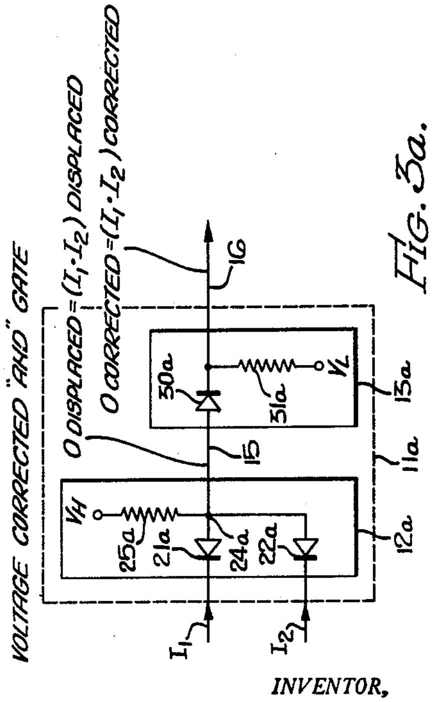

Fig. 3*a* is a circuit diagram of a voltage corrected "and" gate according to the present invention.

Fig. 3*b* is a circuit diagram of a voltage corrected "or" gate according to the present invention.

Figures 2, 4A, 4B:
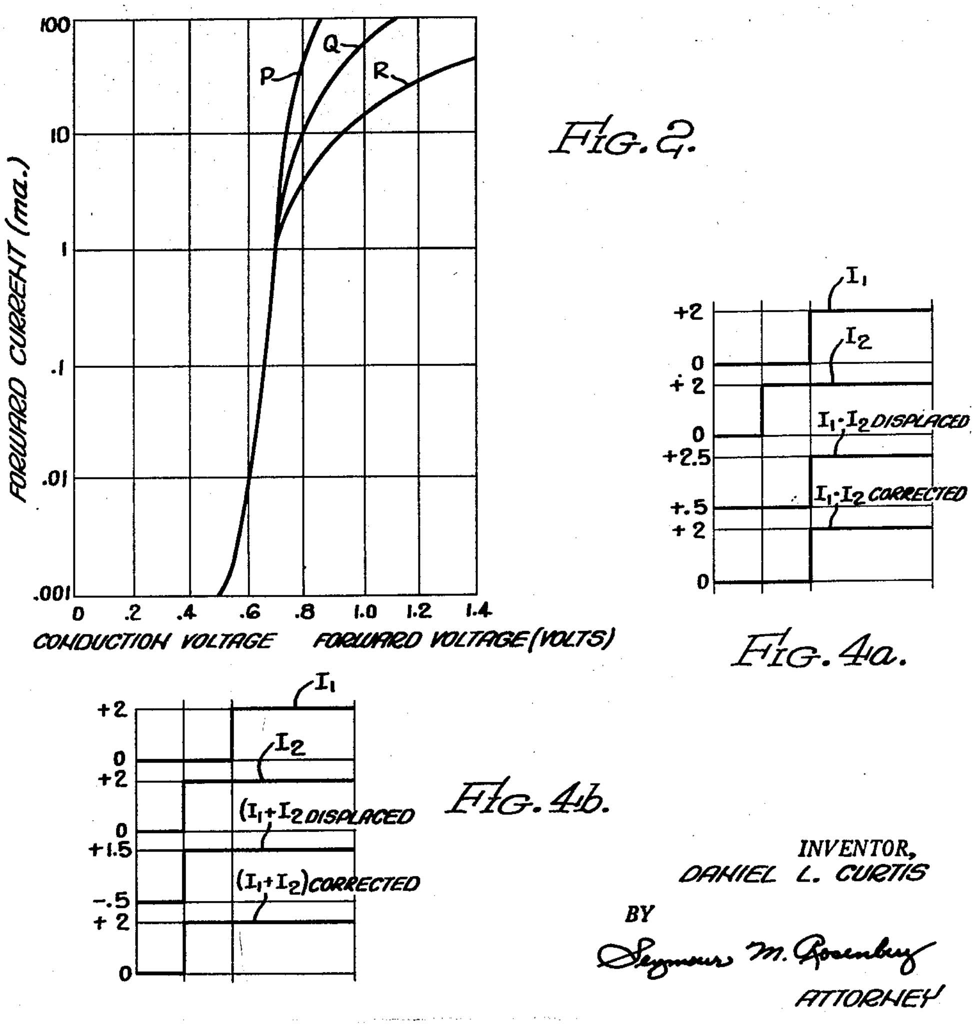
Fig. 2 is a graph illustrating conduction characteristics of a number of semiconductor diode rectifiers which may be utilized in preferred embodiments of the voltage corrected diode gates of the present invention.

Fig. 4*a* is a chart showing certain voltage waveforms illustrative of the operation of the voltage corrected "and" gate shown in Fig. 3*b*.

Fig. 4*b* is a chart showing voltage waveforms illustrative of the operation of the voltage corrected "or" gate shown in Fig. 3*b*.

Figure 5B:
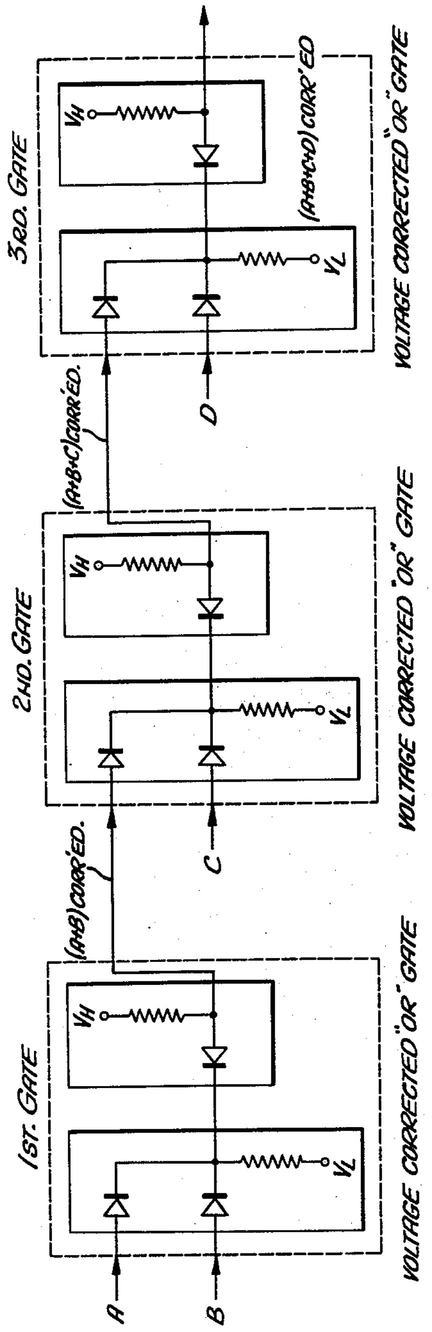
Figure 5C:
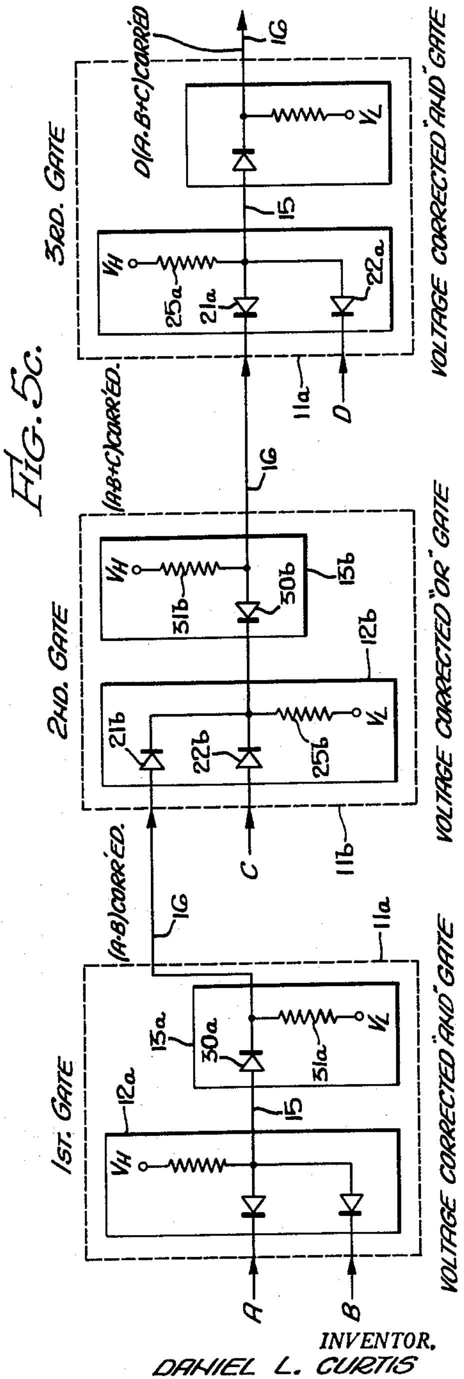
Figure 5A:
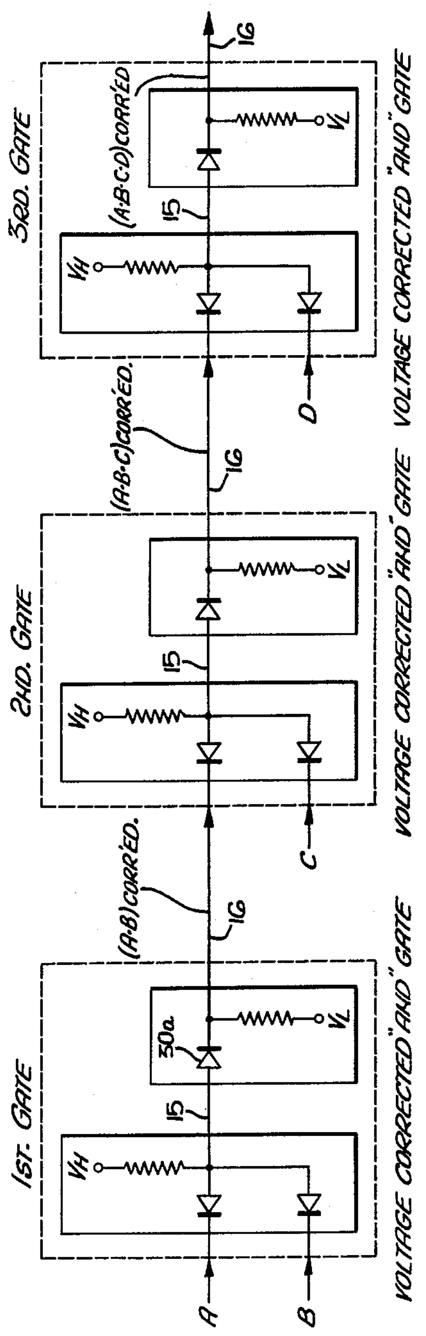

Fig. 5*a* is a circuit diagram showing voltage corrected "and" gates connected together to form a cascaded network of successsive "and" gates.

Fig. 5*b* is a circuit diagram showing voltage corrected "or" gates connected together to form a cascaded network of successive "or" gates.

Fig. 5*c* is a circuit diagram showing voltage corrected "and" gates and voltage corrected "or" gates connected to form a cascaded network of alternately succeeding "and" gates and "or" gates.

Figure 1:
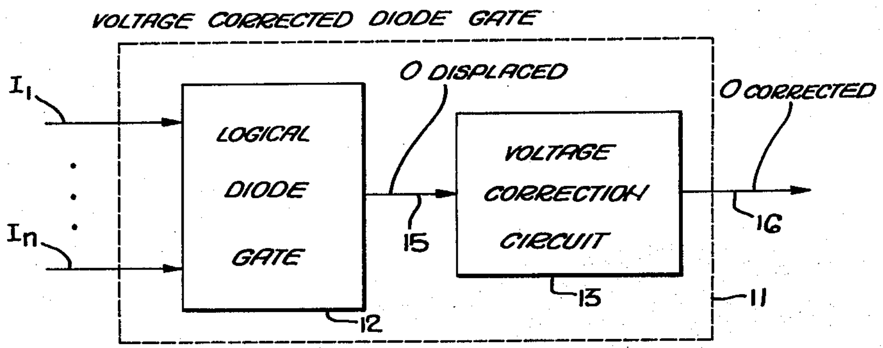
Fig. 1 is a generic block diagram of a voltage corrected diode gate according to the present invention.

Referring now to the drawings wherein like reference characters represent like or corresponding parts throughout the several views, there is shown in Fig. 1 a generic diagram of a voltage corrected diode gate 11 according to the present invention. The voltage corrected diode gate shown in Fig. 1 receives a plurality of applied input signals $I_1$ through $I_n$ (where *n* is the number of input signals applied to the gate), each input signal varying or swinging between a predetermined high voltage level (+2 volts for example) and a predetermined low voltage level (0 volts for example). Voltage corrected diode gate 11 is operable for combining these bilevel input signals in accordance with a predetermined logical operation to form a resultant bilevel output signal $0_{corrected}$ which swings between substantially the same predetermined high and low voltage levels. In other words the voltage level of an output signal produced by the voltage corrected diode gate of the present invention, in contrast to conventional prior art gates, is not displaced with respect to the levels of the input signals applied to the gate. Still another way of describing the output signal $0_{corrected}$ produced by gate 11 is to say that signal $0_{corrected}$ lies in the same voltage region as signals $I_1$ through $I_n$.

As illustrated in Fig. 1, voltage corrected diode gate 11 of the present invention comprises a conventional logical diode gate 12 and a voltage correction circuit 13. Diode gate 12 may be either a prior art "and" gate or "or" gate, utilizing however semiconductor diodes which are characterized by having a predetermined conduction voltage (other than zero volts) at which the diodes have an abrupt transition from high resistance to very low resistance.

Diode gate 12 receives the applied bilevel input signals $I_1$ through $I_n$ and combines them to produce a resultant bilevel output signal $0_{displaced}$ having voltage levels displaced by substantially the predetermined conduction voltage from the levels of the input signals. Voltage correction circuit 13 on the other hand receives the output signal $0_{displaced}$ from gate 11 and substantially restores the signal to the original levels of the input signals before reproducing the signal as the voltage corrected output signal $0_{corrected}$. As shown in Fig. 1 voltage correction circuit 13 has an input conductor 15 along which signal $0_{displaced}$ is applied and an output conductor 16. It will be shown hereinbelow that in all embodiments of the invention, voltage correction circuit 13 will include a semiconductor diode intercoupled between conductors 15 and 16; the diode rectifier having substantially the same conduction voltage as the diode rectifiers in gate 11.

The diode rectifier in voltage correction circuit 13, hereinafter called the correcting diode, is intercoupled between conductors 15 and 16 in such a manner that the voltage displacement of signal $0_{displaced}$ is compensated for by the forward drop across the correcting diode. Thus for example if there is a voltage rise across logical diode gate 12 of .5 volts (due to forward drop across the diodes of gate 12), then the correcting diode in circuit 13 will be connected between conductors 15 and 16 in such a way that its forward drop will subtract from the voltage levels of signal $0_{displaced}$ and thereby substantially restore the signal to the original or predetermined voltage levels. On the other hand if there were a voltage drop of .5 volt across diode gate 12, then the correcting diode within circuit 13 would be intercoupled between conductors 15 and 16 in such a manner that the forward drop across the correcting diode would add to the voltage levels of signals $0_{displaced}$ and thereby again substantially restore signal $0_{displaced}$ to the predetermined voltage levels of the original input signals $I_1$ through $I_n$.

To properly understand the invention, it is desirable to be familiar with the forward conduction characteristics of semiconductor diode rectifiers since the nature of these conduction characteristics greatly influences the effectiveness of the described voltage correction process. Those skilled in the art will understand that two types of diode rectifiers are presently being produced. The first type of rectifier has a gradual but marked increase in conductivity at approximately 0 volt across the rectifier. In other words such a rectifier begins to conduct appreciably as soon as its anode is slightly more positive than its cathode. The second type of rectifier does not begin to conduct appreciably until a fairly large predetermined conduction voltage usually of the order of .2 to .5 of a volt is applied across the diode.

Generally this second type of diode conducts very strongly and very abruptly as soon as the predetermined conduction voltage is applied across it. In addition the predetermined conduction voltage is usually extremely constant for diodes of similar class made by the same manufacturer.

For example there is shown in Fig. 2, a graph illustrative of forward conduction characteristics of three similar classes (P, Q and R) of silicon junction diodes of this second type. It is seen that all three classes of diodes abruptly begin to conduct at a predetermined conduction voltage of .50 volt—that is when the voltage applied to the anodes of the diodes is .50 volt higher than the voltage at the diode cathodes. Moreover all three classes have an identical conduction characteristic until the current passing through the diodes exceeds 1 milliampere volts. It is seen that in this region, the common conduction characteristic of the three classes of diode rectifiers has a very steep slope so that a large increase in current through the diode is accompanied by only a small increase in voltage drop across the diode. Stating these findings in another manner, it might be said that diodes of the described type usually exhibit a very low dynamic resistance when a voltage equal to or in excess of the conduction voltage is applied across the diodes in their forward direction. At voltages below the conduction voltage such diodes are essentially non-conductive.

It is clear, in view of the foregoing explanation, that for diodes of the second type, the principal component of forward drop across the diodes will be the conduction voltage of the diodes. Accordingly, for purposes of simplicity of explanation in the following description, forward drop through the diodes will be treated as being equal to its principal component, that is the conduction voltage of the diodes. Those skilled in the art will understand however that the forward drop through the diodes may in actuality deviate to some extent from the conduction voltage of the diodes because of the voltage contribution made by current flowing through the diodes. The explanation of operation of voltage corrected gates supplied hereinbelow will however serve to demonstrate that in the voltage corrected gates of the present invention the principal component of forward drop (namely the conduction voltage) is entirely compensated for. In addition, those skilled in the art will readily understand that the residual component of forward drop caused by diode current will also be largely compensated for in the voltage corrected gates of the present invention by limiting the current through the gates to a predetermined range in which the forward conduction characteristic has such a steep slope that very little variation in forward voltage occurs.

Before proceeding further with a description of the detailed structure of preferred embodiments of voltage corrected diode gate 11, it is advisable to first clarify the nomenclature relating to the terms "and" gate and "or" gate. In the art relating to semiconductor diode gates which receive bilevel (high or low) input signals and produce corresponding bilevel signals, it is generally understood that an "and" gate is a gate which produces an output signal having a predetermined level only when all input signals to the gate are at the same predetermined level. An "or" gate, on the other hand, is a circuit which produces an output signal having the predetermined level whenever any of the input signals applied to the gate is at this same predetermined level.

It is clear, from the foregoing definitions that an "and" gate for high level signals is a circuit which produces a high output signal only when all bilevel input signals to the gate are high. On the other hand, an "or" gate for high level signals produces a high output signal whenever any of the bilevel input signals to the gate is high. Those skilled in the art will understand that an "and" gate for high level signals will also function as an "or" gate for low level signals (since a circuit which produces high output signals only when all input bilevel signals are high, will also produce a low level signal whenever any of the input signals are low). Similarly it can be shown that a circuit structure which functions as an "or" gate for high level signals will also function as an "and" gate for low level signals. In the present specification, the terms "and" gate and "or" gate will be used as referring respectively to an "and" gate for high level signals and an "or" gate for high level signals.

Referring now to Figs. 3*a* and 3*b*, there is shown in Fig. 3*a* detailed circuit structure of a preferred embodiment of a voltage corrected "and" gate 11*a* and in Fig. 3*b* corresponding circuit structure of a voltage corrected "or" gate 11*b*. Gate 11*a* includes a conventional diode "and" gate 12*a* having a voltage rise thereacross and also includes a voltage correction circuit 13*a* which is coupled to gate 12*a* for receiving its output signal and lowering or dropping the level of this signal so as to compensate for the voltage rise across gate 11*a*. Gate 11*b* on the other hand includes a conventional "or" gate 12*b* having a voltage drop thereacross and also includes a voltage correction circuit 13*b* coupled thereto for raising the voltage level of the output signal produced by gate 12*b* so as to compensate for the voltage drop across gate 13*a*.

Referring first to Fig. 3*a*, voltage corrected "and" gate 11*a* is shown for purposes of example as receiving two bilevel input signals $I_1$ and $I_2$, gate 11*a* combining these input signals to form an output signal $(I_1 \cdot I_2)_{\text{corrected}}$ (where the ($\cdot$) indicates the logical "and" operation) which has a high level only when both input signals $I_1$ and $I_2$ are at their high levels. The output signal $(I_1 \cdot I_2)_{\text{corrected}}$ is in the same voltage region as the input signals $I_1$ and $I_2$—that is the output signal $(I_1 \cdot I_2)_{\text{corrected}}$ wing between substantially the same high and low voltage level as the input signal $I_1$ and $I_2$.

As shown in Fig. 3*a*, voltage corrected "and" gate 11*a* includes a conventional diode "and" gate 12*a* receiving signals $I_1$ and $I_2$ and combining them to form an output signal $(I_1 \cdot I_2)_{\text{displaced}}$ which it will be shown, has slightly higher voltage levels than the input signals $I_1$ and $I_2$, the amount of rise in voltage level across the gate being substantially equal to the conduction voltage of a pair of semiconductor diode rectifiers 21*a* and 22*a* included within gate 12*a*. Signal $(I_1 \cdot I_2)_{\text{displaced}}$ is applied over conductor 15 to a voltage correction circuit 13*a* also included within "and" gate 11*a*, voltage correction circuit 13*a* functioning to substantially drop the voltage levels of signal $(I_1 \cdot I_2)_{\text{displaced}}$ back to the original levels of the input signals before reproducing the signal as signal $(I_1 \cdot I_2)_{\text{corrected}}$ which is applied along output conductor 16.

Within diode "and" gate 12*a*, the anodes of diode rectifiers 21*a* and 22*a* are connected to a common terminal 24*a* which is connected to conductor 15 and is also coupled through a so-called "pull-up" resistor 25*a* to a source of relatively high voltage $V_H$. The term "pull-up" has no reference to any characteristics of resistor 25*a*, but refers instead to the fact that the resistor couples terminal 24*a* to a source of voltage $V_H$ which will, in most gates, have a voltage level at or above the high levels of signals $I_1$ and $I_2$. Input signals $I_1$ and $I_2$ are applied to the cathodes of diodes 21*a* and 22*a* respectively. Those skilled in the art will understand that if additional input signals were to be combined in the gate, a corresponding number of additional diodes, similarly connected, would be provided in gate 12*a*. The resultant output signal $(I_1 \cdot I_2)_{\text{displaced}}$ produced by gate 11*a* appears at terminal 24*a* and is thereby applied along conductor 15 to correction circuit 13*a*.

Within correction circuit 13*a*, a semiconductor diode rectifier 30*a* is intercoupled as a correcting diode between conductors 15 and 16, the direction of interconnection being selected so that the forward drop through correcting diode 30*a* subtracts from the voltage levels of a signal applied along conductor 15, to thereby compensate or correct for the rise in voltage level across the conventional "and" gate 12*a*. To obtain this subtractive effect, the anode of correcting diode 30*a* is connected to input conductor 15 and the cathode to output conductor 16. A "pull-down" resistor 31*a* may be coupled between conductor 16 and a source of relatively low voltage $V_L$. It will be shown however that pull-down resistor 31*a* is not required under certain specific circumstances in which an equivalent conductive impedance return to a source of low voltage is supplied by subsequent circuits coupled to output conductor 16.

It will be noted in connection with Fig. 3*a*, that in the overall configuration of voltage corrected "and" gate 11*a*, correcting diode 30*a* is in a so-called back-to-back relationship with diodes 21*a* and 22 of gate 12*a*—that is like terminals (anode-to-anode or cathode-to-cathode) of the diode rectifiers are coupled together at the common junction terminal 24*a*. It will become clear, at a later point in the present specification that such a back-to-back relationship is an essential requirement of the invention, which will be satisfied in all embodiments of the invention, whether the correcting diode be connected for lowering or raising the levels of the output signal produced by a preceding diode gate.

In considering the overall operation of voltage corrected diode "and" gate 11*a* shown in Fig. 3*a*, let it be assumed for purposes of example that signals $I_1$ and $I_2$ each swing between high and low levels of 0 and +2 volts and that the voltage $V_H$ has a level at or above +2 volts, as for example +15 volts. Let it also be assumed that diodes 21*a* and 22*a* and correcting diode 30*a* each have like forward conduction characteristics characterized by a sharp transition between very low conductivity and high conductivity at a predetermined conduction voltage (+.5 volt for example). Assume further that voltage $V_L$ has a level at or below 0 volts (−15 volts for example).

It is clear that, in the normal operation of "and" gate 11*a*, because of the application of voltage $V_H$ through resistor 25*a*, the voltage at terminal 24*a* will tend to rise to +15 volts. If initially signals $I_1$ and $I_2$ are both at their low level (0 volts), when the voltage at terminal 24*a* rises to 0.5 volt, both diodes 21*a* and 22*a* will become conductive, since then each of the diodes will have a voltage applied to its anode which is higher by the conduction voltage (.5 volt) than the voltage (0 volts) applied to its cathode. The diodes 21*a* and 22*a*, rendered conductive in this manner will directly couple terminal 24*a* to the source of signals $I_1$ and $I_2$, thereby preventing the voltage at terminal 24*a* from rising appreciably above this level of 0.5 volt.

If now one of the input signals, $I_2$ for example, were to be raised in voltage to its high level +2 volts, then diode 22*a* would have a higher voltage at its cathode than at its anode and therefore would be back biased or nonconductive. Thus a rise of one of the input signals ($I_2$) to its high level has no effect upon the voltage at terminal 24*a* since the associated diode rectifier (22*a*) becomes nonconductive and thereby isolates signal $I_2$ from terminal 24*a*. However, if both signals $I_1$ and $I_2$ are raised to their high levels (+2 volts), then the voltage at terminal 24*a* is free to rise once again until it reaches a level higher by the conduction voltage (.5 volt) than the high voltage level (+2 volts) of signals $I_1$ and $I_2$. Therefore if signals $I_1$ and $I_2$ are both raised to their high levels, the voltage at terminal 24*a* will rise to 2.5 volts before diodes 21*a* and 22*a* again become conductive and thereby prevent further rise of voltage at terminal 24*a*.

It is thus seen that the voltage level of signal $I_1 \cdot I_2$ displaced formed at terminal 24*a* is high only when signals $I_1$ and $I_2$ are both high and is low if either of the signals $I_1$ or $I_2$ is low. Moreover the voltage at terminal 24*a* is positively displaced from the voltage levels of $I_1$ and $I_2$ by an amount substantially equal to the conduction voltage .5 volt since the voltage at terminal 24*a* swings between .5 volt and 2.5 volts rather than between 0 volts and 2 volts.

Next will be considered the operation of voltage correction circuit 13*a* in compensating for the voltage rise across the conventional diode "and" gate 12*a*. Because of the application of voltage $V_L$ (−15 volts) through pull-down resistor 31*a*, the voltage upon conductor 16 tends to fall or be "pulled-down" towards −15 volts. The voltage upon conductor 16 will therefore fall until such time as diode 30*a* becomes conductive and thereby prevents further drop in voltage. If the signal applied along conductor 15 to the anode of diode 30*a* is at its high level 2.5 volts, the voltage upon conductor 16 (and hence at the cathode of diode 30*a*) can fall to 2 volts before diode 30*a* can become conductive to thereby prevent further voltage fall. On the other hand if the voltage upon conductor 15 is at its low level .5 volt, the voltage upon conductor 15 can drop to zero volts before diode 30*a* becomes conductive to prevent further voltage fall.

Illustrative voltage waveforms of signals $I_1$ and $I_2$, of the signal $(I_1 \cdot I_2)_{\text{displaced}}$ and of the signal $(I_1 \cdot I_2)_{\text{corrected}}$ are displayed on a common time scale in Fig. 4*a*. These waveforms correspond to the description of operation provided hereinabove in connection with Fig. 3*a*. As shown in Fig. 4*a*, when signals $I_1$ and $I_2$ are initially both at their low levels, 0 volts, the output signal $I_1 \cdot I_{2\,\text{displaced}}$ produced by "and" gate 11*a* is also at its low positively displaced level 0.5 volt. The signal $I_1 \cdot I_{2\,\text{displaced}}$ rises to its positively displaced high level (2.5 volts) only when both input signals $I_1$ and $I_2$ rise to their high levels (2.0 volts). The signal $(I_1 \cdot I_2)_{\text{corrected}}$ produced by correction circuit 13*a* is seen to be a reproduction of signal $I_1 \cdot I_{2\,\text{displaced}}$ restored however to the original voltage levels (0 and +2 volts) of signals $I_1$ and $I_2$.

Thus it is clear that in the overall operation of gate 11*a* the signal $I_1 \cdot I_{2\,\text{corrected}}$ which appears upon conductor 16 is a reproduction of the signal $I_1 \cdot I_{2\,\text{displaced}}$ which is applied along conductor 15, differing therefrom only in that its voltage levels have been lowered by an amount substantially equal to the conduction voltage of diode 30*a*. Since the conduction voltage of diode 30*a* is substantially equal to the conduction voltages of diodes 21*a* and 21*b*, the voltage rise across "and" gate 12*a* is largely compensated for by the voltage drop across the diode correction circuit 13*a*.

Referring now to the voltage corrected "or" gate 11*b* shown in Fig. 3*b* it is seen that gate 11*b* includes a conventional diode "or" gate 12*b* receiving input signals $I_1$ and $I_2$ to form an output signal $(I_1+I_2)_{\text{displaced}}$ having voltage levels negatively displaced with respect to the levels of the input signals, the amount of displacement being substantially equal to the conduction voltage of a pair of diodes 21*b* and 22*b* included within gate 12*b*. Signal $(I_1+I_2)_{\text{displaced}}$ is applied over conductor 15 to voltage correction circuit 13*b* which functions to raise the voltage levels of signal $(I_1+I_2)_{\text{displaced}}$ towards the original levels of the input signals, before reproducing the signal as signal $(I_1+I_2)_{\text{corrected}}$ which is applied along output conductor 16.

Within conventional diode "or" gate 12*b*, the cathodes of diodes 21*b* and 22*b* are connected to a common terminal 24*b* which is connected to conductor 15 and is also coupled through a "pull-down" resistor 25*b* to the source of relatively low voltage $V_L$ (assumed for example to be −15 volts). Input signals $I_1$ and $I_2$ are applied to the anodes of diodes 21*b* and 22*b*, respectively. The resultant or combined signal $(I_1+I_2)_{\text{displaced}}$ appears at terminal 24*b* and is thereby applied along conductor 15 to correction circuit 13*b*.

Considering the structure of correction circuit 13*b*, it is seen that a correcting diode 30*b* has its cathode connected to conductor 15 and its anode connected to conductor 16 so that the forward drop across the diode will add to the voltage levels of applied signals to thereby compensate or correct for the drop in voltage level across conventional "or" gate 12*b*. A "pull-up" resistor 31*b* may be coupled between conductor 16 and the source of voltage $V_H$ (assumed to be +15 volts). It will be shown however that pull-up resistor 31*b* is not required under certain circumstances in which an equivalent impedance return to a source of high voltage is supplied by subsequent circuits coupled to conductor 16.

In considering the operation of voltage corrected "or" gate 11*b*, it will be assumed that initially signals $I_1$ and $I_2$ are both low (0 volts) and that later, first signal $I_2$ and then signal $I_1$ are raised to their high levels (+2 volts). Illustrative voltage waveforms of signals $I_1$ and $I_2$ $(I_1+I_2)_{\text{displaced}}$ and $(I_1+I_2)_{\text{corrected}}$ are shown in Fig. 4*b* for this sequence of operation.

It is clear that in the normal operation of voltage corrected "or" gate 11*b* shown in Fig. 3*b*, the voltage at terminal 24*b* tends to fall or be "pulled-down" towards the voltage $V_L$ (−15 volts) supplied to the terminal through resistor 25*b*, this fall in voltage being arrested only when either of the diodes 21*b* or 22*b* becomes conductive. Thus when signals $I_1$ and $I_2$ are both at their low levels (0 volts), the voltage at terminal 24*b* (signal $(I_1+I_2)_{\text{displaced}}$) will descend as shown in Fig. 4*b* to −.5 volt (where .5 volt is assumed to be the conduction voltage of diodes 21*b* and 22*b*) before the diodes become conductive and arrest the voltage at this level (−.5 volt). However when signal $I_2$ rises to high level (+2 volts), the voltage at terminal 24*b* also tends to rise above its former −.5 volt level. Immediately, therefore diode 21*b* becomes nonconductive, since it no longer has the conduction voltage (.5 volt) applied across it, and in this manner the source of signal $I_1$ is isolated from terminal 24*b*. Therefore the resultant voltage level at terminal 24*b* is determined only by the higher signal $I_2$ rather than by the lower and now isolated signal $I_1$. The voltage at terminal 24*b* (signal $(I_1+I_2)_{\text{displaced}}$), as shown in Fig. 4*b*, therefore follows the rise of signal $I_2$ and is finally stabilized at a level (1.5 volts) at which diode 22*b* is nonconductive.

Later when, as illustrated in Fig. 3*b*, signal $I_1$ also rises to its high level (2.0 volts), diode 21*b* also becomes conductive and thereby assists in maintaining the voltage level of signal $(I_1+I_2)_{\text{displaced}}$ at terminal 24*b* at its negatively displaced high level of 1.5 volts. It will be understood of course, that if signal $I_1$ rather than signal $I_2$ has risen first to its high level, it too would have been effective in raising signal $(I_1+I_2)_{displaced}$ to its negatively displaced high level of 1.5 volts.

It is thus seen that the voltage level of signal $(I_1+I_2)_{displaced}$ is high whenever any of the input signals $I_1$ or $I_2$ is high and is low only when both of the input signals $I_1$ and $I_2$ are low. Moreover the voltage levels of signal $(I_1+I_2)_{displaced}$ are negatively displaced from the voltage levels of the input signals $I_1$ and $I_2$ by an amount substantially equal to the conduction voltage of the diodes 21*b* and 22*b*, since the voltage at terminal 24*b* swings substantially between −.5 volt and 1.5 volts rather than between 0 volts and 2 volts.

As stated hereinbefore, voltage correction circuit 13*b* shown in Fig. 3*b* corrects this negative voltage displacement of signal $(I_1+I_2)_{displaced}$ before reproducing it as the signal $(I_1+I_2)_{corrected}$ applied to conductor 16. Because of the application of voltage $V_H$ (assumed to be +15 volts) through pull-up resistor 31*b*, the voltage upon conductor 16 (signal $(I_1+I_2)_{corrected}$) tends to be "pulled-up" towards +15 volts, and will therefore rise until diode 30*b* becomes conductive and thereby prevents further rise in voltage by effectively directly connecting conductor 16 to conductor 15.

Thus when signal $(I_1+I_2)_{displaced}$ is at its low level (−.5 volt), signal $(I_1+I_2)_{corrected}$ will rise, as shown in Fig. 3*b*, to 0 volts before diode 30*b* becomes conductive. On the other hand when signal $(I_1+I_2)_{displaced}$ rises to its high level (1.5 volts), signal $(I_1+I_2)_{corrected}$ will rise as shown in Fig. 4*b* to 2 volts before diode 30*b* becomes conductive again. It is therefore clear that signal $(I_1+I_2)_{corrected}$ produced by correction circuit 13*b* is a reproduction of signal $(I_1+I_2)_{displaced}$, restored however to the original voltage levels of the input signals $I_1$ and $I_2$. In other words the voltage rise across correction circuit 13*b* compensates for the voltage drop across the conventional "or" gate 12*b*.

It is clear in view of the foregoing that if a plurality of conventional "and" gates employing diodes having a predetermined conduction voltage, were to be "cascaded" (each "and" gate supplying its output signal as an input signal to a succeeding "and" gate) there would be a rise in voltage level substantially equal to the conduction voltage across each gate. If the conduction voltage were .5 volt for example, the voltage levels would rise .5 volt across the first gate of a cascaded group of gates, and .5 volt across the second gate, for a total displacement of 1 volt. Thus an original signal swing between 0 and +2 volts would be raised to a swing between 1 and +3 volts after two stages of gating. A third stage "and" gate receiving the voltage displaced signal as one input signal and an undisplaced (0 to 2 volts) signal as another input signal would probably be rendered inoperable because of the wide divergence between the voltage levels of the input signals to the third stage gate. In addition a second stage gate in such a cascaded arrangement would at least have its reliability impaired for the same reasons.

In the same manner, when conventional "or" gates are cascaded there is a voltage drop across each successive stage of gating which will certainly impair the operation of a second stage of gating and will probably prohibit the use of a third stage of gating.

However when the use of the voltage corrected "and" gates of the present invention is contemplated, it is clear that such "and" gates may be indefinitely cascaded without ill effect, since voltage levels are restored to their original values at each stage of gating. Similarly voltage corrected "or" gates may also be cascaded without deleterious effect.

For example referring to Fig. 5*a* there are shown three voltage corrected "and" gates connected in a cascaded arrangement each "and" gate supplying its output signal as an input signal to a succeeding "and" gate. The first voltage corrected "and" gate shown in Fig. 5*a* receives bilevel input signals A and B (each swinging for example between 0 and +2 volts) and produces an output signal $(A \cdot B)_{corrected}$ which is high only when signals A and B are both high, signal $(A \cdot B)_{corrected}$ swinging between substantially the same levels (0 to +2 volts). In the second "and" gate the signal $(A \cdot B)_{corrected}$ is combined with a signal C (also swinging between 0 and +2 volts) to form an output signal $(A \cdot B \cdot C)_{corrected}$ which also swings between the original levels (0 and +2 volts). The described operation is repeated in the third "and" gate in which the signal $(A \cdot B \cdot C)_{corrected}$ is combined with a signal D to form an output signal $$(A \cdot B \cdot C \cdot D)_{corrected}$$

which is high only when all of the input signals A and B and C and D are high, the signal $$(A \cdot B \cdot C \cdot D)_{corrected}$$

still swinging between substantially the same levels (0 to +2 volts).

It is seen moreover from a consideration of Fig. 5*a* that each of the cascaded "and" gates receives input signals varying between the same levels (0 and +2 volts) and therefore, it is clear that fully reliable operation of each of the cascaded "and" gates may be expected.

In Fig. 5*b* there is shown for purposes of example a corresponding cascaded arrangement of three voltage corrected "or" gates. The first "or" gate receives signals A and B and supplies its resultant signal $(A+B)_{corrected}$ to a second voltage corrected "or" gate which combines this signal with input signal C to form the signal $(A+B+C)_{corrected}$. This signal is supplied to a third "or" gate which combines it with an input signal D to form a resultant signal $(A+B+C+D)_{corrected}$ which is high whenever any of the input signal A or B or C or D is high. The output signal $(A+B+C+D)_{corrected}$ and the preceding output signals $(A+B+C)_{corrected}$ and $(A+B)_{corrected}$, each swing between the same primary voltage levels (0 and +2 volts). As a result reliable operation is obtained in each of the cascaded "or" gates.

In Fig. 5*c* there is shown a cascaded arrangement of alternate voltage corrected "and" gates and voltage corrected "or" gates. The first gate in this cascaded arrangement is a voltage corrected "and" gate receiving signals A and B and supplying its resultant output signal $(A \cdot B)_{corrected}$ as an input signal to the second gate, a voltage corrected "or" gate, which in turn combines this input signal with an additional input signal C to form the output signal $(A \cdot B+C)_{corrected}$. The signal $$(A \cdot B+C)_{corrected}$$

is in turn supplied as an input signal to the 3rd gate, a voltage corrected "and" gate which combines this signal with another input signal D to form the signal $D \cdot (A \cdot B+C)_{corrected}$.

Since each of the input signals A, B, C and D swing between the same levels (assumed to be 0 and +2 volts), each of the output signals $A \cdot B_{corrected}$, $(A \cdot B+C)_{corrected}$ and $D(A \cdot B+C)_{corrected}$ produced by the gates also swing between the same levels (0 to +2 volts). As a result fully reliable operation is obtained for each of the gates, since each gate receives only input signals between the same levels.

It should be noted that in this cascaded "and"—"or"—"and" arrangement of gates, it is permissible to remove the pull-down resistor 31*a* (shown in Fig. 3*a*) from the voltage correction circuit 13*a* of the 1st "and" gate. It is also permissible to remove the pull-up resistor 31*b* from the voltage correction circuit 13*b* of the following "or" gate. As stated hereinbefore, removal of these resistors is permissible because in each case, the succeeding gate furnishes a conductive path to the required voltage source and thereby accomplishes the function of the removed resistor.

For example referring in Fig. 5c to the 1st gate, it is clear that a conductive impedance path between conductor 16 and the source of low voltage $V_L$ is supplied by the diode 21b and resistor 25b in the succeeding "or" gate. Therefore a separate resistive connection between conductor 16 and $V_L$ is not required.

However it is equally clear that the continued use and inclusion of correcting diode 30a is essential to the invention. If diode 30a were not used—that is if conductors 15 and 16 were directly connected—the signal $(A \cdot B)_{\text{displaced}}$ which would then be applied to the 2nd gate would have voltage levels .5 volt higher (where .5 volt is assumed as the conduction voltage) than the voltage of signal C. As a result reliable operation of the 2nd gate would be impaired. However through the use of correcting diode 30, full voltage correction is accomplished and reliable operation is thereby obtained.

In the same manner referring to the 2nd gate, the voltage corrected "or" gate, it is clear that a conductive impedance path between conductor 16 and the source of high voltage $V_H$ is supplied by diode 21a and resistor 25a in the succeeding "and" gate, thereby rendering unnecessary use of a separate resistor intercoupling conductor 16 and the source of $V_H$. Full voltage correction however is accomplished by correcting diode 30b.

In the foregoing description of the operation of voltage corrected diode gates mechanized in accordance with the present invention input signals to such gates have been described as having continuing high and low voltage levels extending over considerable periods of time, while the operating voltages to the gates (such as $V_H$ and $V_L$) have been described as having unvarying high and low voltage levels respectively. Those skilled in the art, will however readily understand that the basic gating structure described hereinabove will operate just as effectively when some or all of the input signals and voltages $V_H$ and $V_L$ are applied only in brief pulses.

For example in one system of logical gating, described by C. L. Wanlass in article entitled "Transistor Circuitry for Digital Computers" at page 11 of the IRE Transactions on Electrical Computers, volume EC–4, Number 1, published March 1955, the voltage $V_H$ is applied only as a pulse (a so-called clock pulse) to the "pull-up" resistors of "and" gates employed in diode gating networks. Under these circumstances all "and" gates employed in such networks are operated only when the clock-pulse $V_H$ is applied. However, during the pulse, operation is essentially the same as hereinbefore described and it is therefore clear that voltage corrected diode gates such as hereinbefore described could be utilized in connection with pulsed $V_H$ (or $V_L$) voltages and would yield the same valuable advantages described above in connection with the more conventional voltage level gating.

Another system of gating is known in which one signal, a clock-pulse signal, is applied only as a pulsed input signal to "and" gates utilized in logical gating networks, these clock-pulse signals being applied to diode rectifiers of the "and" gates in the same manner that voltage level signals are applied to other diode rectifiers of the "and" gates. In this gating system also, "and" gates receiving the clock-pulse signal are inoperative except when the clock-pulse signal is applied, and operate during the pulse in essentially the same manner as hereinbefore described. In this system, also, the voltage corrected gates described above may be profitably employed.

In still a third system of gating, clock-pulses are supplied to the gates as sharp voltage spikes superimposed upon normal voltage level signals. Voltage corrected gates yield all of their described advantages when employed with such a system, giving full voltage correction both to the normal voltage level signals and to the superimposed clock-pulse signals.

It is therefore seen that the voltage corrected diodes of the present invention may be utilized to yield important advantages in connection with almost any system of diode gating utilizing input signals having low voltage swings.

What is claimed as new is:

1. In a diode logic network, a gate circuit having at least two inputs and a common output with a diode rectifier connected between each input and the common output and means connecting an unregulated voltage to the common output having a polarity in a direction to render each gate diode conducting, a voltage correcting means for continuously reproducing the signal appearing on the output of the gate less the voltage drop across the gate diodes, said voltage correcting means having only a single input and a single output and a diode rectifier therebetween, said voltage correcting diode being poled in an opposite polarity from the diodes of the gate circuit, and means connecting an unregulated voltage to the output of the correcting means having a polarity in a direction to render said correcting diode conducting, whereby the voltage drop across said correcting diode is continuously maintained constant and substantially equal and opposite to the voltage drop across said gate diodes.

2. A voltage corrected diode gate comprising: a logical diode gating circuit having at least two inputs, and a common output and including a plurality of semiconductor diode rectifiers having substantially equal predetermined conduction voltages, said gating circuit being operable for combining a plurality of applied bilevel input signals each varying between a predetermined "high" voltage level and a predetermined "low" voltage level to produce a resultant bilevel output signal displaced by the predetermined conduction voltage from the predetermined levels of the input signals; and diode voltage correction means coupled to said gating circuit output for continuously reproducing said resultant gating circuit output signal restored to the predetermined levels of said input signals, said correction means having only a single input terminal for receiving said resultant gating circuit output signal, a single output terminal, a semiconductor correcting diode intercoupled between said input and output terminals, said correcting diode having a conduction voltage substantially equal to the predetermined conduction voltage, said semiconductor correcting diode being poled in opposite polarity from the diode rectifiers of the gating circuits, and means connecting an unregulated power source for energizing said correcting diode in a forward direction to cause condition therethrough whereby the voltage drop across said correcting circuit diode is continuously equal and opposite to the voltage drop across the diodes in the gate circuit.

3. The voltage corrected diode gate defined by claim 2 wherein each of said plurality of semiconductor diode rectifiers in the gate circuit has an anode, each anode being connected to said single input terminal of said voltage correction means and wherein said correcting diode has an anode and a cathode, the anode of said correcting diode being connected to said input terminal and the cathode of said correcting diode being connected to said output terminal.

4. The voltage corrected diode gate defined by claim 3 which includes a "pull-up" resistor having first and second ends, said first end being connected to said input terminal, and means for applying a relatively high voltage to said second end of said pull-up resistor.

5. The voltage corrected diode gate defined by claim 4 wherein said unregulated power source includes a "pull-down" resistor, and means for applying a relatively low level voltage to said output terminal through said pull-down resistor.

6. The voltage corrected diode gate defined by claim 2 wherein each of said plurality of semiconductor diode rectifiers of the gating circuit has a cathode, each cathode being connected to said single input terminal of said voltage correction means and wherein said correcting diode has an anode and a cathode, the cathode of said correcting diode being connected to said single input terminal and the anode of said correcting diode being connected to said output terminal.

7. The voltage corrected diode gate defined in claim 6 which includes a "pull-down" resistor interconnected between said input terminal and a source of relatively low voltage.

8. The voltage corrected diode gate defined by claim 7 wherein said unregulated power source includes a "pull-up" resistor interconnected between the output terminal of the voltage correcting means and a source of relatively high voltage.

9. The diode logic network defined by claim 1 wherein the gate circuit is an and-gate and the voltage correcting means continuously reproduces the signal appearing on the common output of the gate less the voltage drop across the gate diodes.

10. The diode logic network defined by claim 1 wherein the gate circuit is an or-gate and the voltage correcting means continuously reproduces the signal appearing on the common output of the gate less the voltage drop across the gate diodes.

11. The diode logic network of claim 1 and including a second gate circuit having at least two inputs and a common output and means connecting the single output of the voltage correcting means to an input of the second gate circuit.

12. In the diode logic network of claim 11, said first mentioned gate circuit comprising an and-gate.

13. In the diode logic network of claim 12, the means for connecting an unregulated voltage to the common output of the first mentioned gate includes a "pull-up" resistor connected to the common output thereof and means energizing said resistor with a high voltage, said second gate comprising an and-gate, and said means connecting an unregulated voltage to the output of the correcting means comprising a resistor connected to the output thereof and being energizable by a low voltage.

14. The diode logic network of claim 1 wherein said gate is an or-gate and including a second gate circuit having at least two inputs and a common output and means connecting the single output of the voltage correcting means to an input of the second gate circuit.

15. The diode logic network of claim 14 wherein said second gate is an or-gate.

16. The diode logic network of claim 15 wherein the means for connecting an unregulated voltage to the first mentioned gate includes a "pull-down" resistor energizable by a low voltage, and said means connecting an unregulated voltage to the output of the correcting means including a resistor energizable by a high voltage.

17. A diode logic network as in claim 1 and including a second gate circuit having at least two inputs and a common output with a diode rectifier connected between each input and the common output and means connecting an unregulated voltage to the common output having a polarity in a direction to render each gate diode conducting, means connecting the single output of the voltage correcting means to an input of the second gate circuit, and the means for connecting unregulated voltages to the outputs of each of the gate circuits and the voltage correcting means including a different resistor connected to each said output and being energizable by a voltage having a polarity in a direction to render the diodes in the gates and correcting means conducting.

References Cited in the file of this patent

UNITED STATES PATENTS

| | | |
|---|---|---|
| 2,706,811 | Steele | Apr. 19, 1955 |
| 2,712,065 | Elbourn et al. | June 28, 1955 |
| 2,748,269 | Slutz | May 29, 1956 |
| 2,798,667 | Spielberg et al. | July 9, 1957 |

OTHER REFERENCES

Publication I: Arithmetic Operations in Digital Computers, Richard, 1955, page 226.